(12) United States Patent
Kubota et al.

(10) Patent No.: US 6,495,397 B2
(45) Date of Patent: Dec. 17, 2002

(54) FLUXLESS FLIP CHIP INTERCONNECTION

(75) Inventors: Jiro Kubota, Ibaraki-ken (JP); Kenji Takahashi, Ibaraki-ken (JP)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/821,331

(22) Filed: Mar. 28, 2001

(65) Prior Publication Data

US 2002/0140094 A1 Oct. 3, 2002

(51) Int. Cl.[7] .................. H01L 21/44; H01L 21/48; H01L 21/50
(52) U.S. Cl. .................. 438/108; 438/613; 438/614; 228/180.21; 228/180.22
(58) Field of Search .................. 438/108, 613, 438/614; 228/180.21, 180.22

(56) References Cited

U.S. PATENT DOCUMENTS

| | | |
|---|---|---|
| 5,019,673 A | 5/1991 | Juskey et al. |
| 5,111,279 A | 5/1992 | Pasch et al. |
| 5,150,274 A | 9/1992 | Okada et al. |
| 5,299,730 A | 4/1994 | Pasch et al. |
| 5,410,805 A | 5/1995 | Pasch et al. |
| 5,438,477 A | 8/1995 | Pasch |
| 5,508,561 A | 4/1996 | Tago et al. |
| 5,710,071 A | 1/1998 | Beddingfield et al. |
| 5,744,869 A | 4/1998 | Root |
| 5,778,913 A | 7/1998 | Degani et al. |
| 5,784,780 A | 7/1998 | Loo |
| 5,816,478 A | 10/1998 | Kaskoun et al. |
| 5,834,366 A * | 11/1998 | Akram .................. 438/614 |
| 5,942,798 A | 8/1999 | Chiu |
| 6,011,312 A | 1/2000 | Nakazawa et al. |
| 6,051,889 A | 4/2000 | Shimura |
| 6,087,732 A | 6/2000 | Chittipeddi et al. |
| 6,111,317 A | 8/2000 | Okada et al. |
| 6,121,689 A | 9/2000 | Capote et al. |
| 6,127,731 A * | 10/2000 | Hoffmeyer .................. 257/750 |
| 6,344,234 B1 * | 2/2002 | Dalal et al. .................. 427/96 |

FOREIGN PATENT DOCUMENTS

| | | |
|---|---|---|
| JP | 63-208251 | 8/1988 |
| JP | 63-004652 | 9/1988 |

OTHER PUBLICATIONS

Pooya Tadayon, Sort Test Technology Development, Intel Corporation. "Thermal Challenges During Microprocessor Testing".Intel Technology Journal Q3, Aug. 22, 2000.pp. 1–8.

(List continued on next page.)

*Primary Examiner*—David L. Talbott
*Assistant Examiner*—David A. Zarneke
(74) *Attorney, Agent, or Firm*—Blakely, Sokoloff, Taylor & Zafman LLP

(57) ABSTRACT

A flip chip method of joining a chip and a substrate is described. A thermo-compression bonder is utilized to align the chip and substrate and apply a contact force to hold solder bumps on the substrate against metal bumps on the chip. The chip is rapidly heated from its non-native side by a pulse heater in the head of the bonder until the re-flow flow temperature of the solder bumps is reached. Proximate with reaching the re-flow temperature at the solder bumps, the contact force is released. The solder is held above its re-flow temperature for several seconds to facilitate wetting of the substrate's metal protrusions and joining. Metal caps comprised of a noble metal such as palladium is applied to the surface of the metal bumps to prevent the metal bumps (which generally comprise a highly-conductive and highly-reactive metal such as copper) from oxidizing in the elevated temperatures just prior to and during the re-flow operation.

23 Claims, 6 Drawing Sheets

OTHER PUBLICATIONS

Dory, Takahashi, Kume, Kubota, Seki and Fujiyama, "Simultaneous Chip–Join and Underfill Assembly Technology for Flip–Chip Packaging". Intel Technology Journal Q3, pp. 1–7, Aug. 22, 2000.

Polka, Chickamenahalli, Chung, Figueroa, Li, Merley, Wood and Zu, "Package–Level Interconnect Design for Optimum Electrical Performance". Intel Technology Journal Q3, pp. 1–17, Aug. 22, 2000.

Viswanath, Wakharar, Watwe and Lebonheur, "Thermal Performance Challenges from Silicon to Systems". Intel Technology Journal Q3, pp. 1–16, Aug. 22, 2000.

Nicholas P. Mencinger, Assembly Technology Development and Reliability, Intel Corp. "A Mechanism–Based Methodology for Processor Package Reliability Assessments". Intel Technology Journal Q3, pp. 1–8, Aug. 22, 2000.

John H. Lau, "Flip Chip Technologies",1995 (Electronic Packaging and Interconnection Series) (P–5–K2D36). McGraw–Hill Companies Inc. ©1996. pp. 1–565.

David Lammers, Flip Chip Packages Go Mainstream, Webpage[online].EE Times.com, Aug. 17, 2000. [Retrieved on Oct. 6, 2000] Retrieved from the Internet:<URL:www.eetimes.com/story/OEG20000817S0024 pp. 1–5.

Nasser Grayeli, Microprocessor Packaging: Evolution and Future Challenges, WebPage.[online]. Developer Intel, ©2000.[Retrieved on Oct. 5, 2000] Retrieved from the internet:<URL:http://developer.intel.com/technology/itj/q32000/foreword.htm.pp. 1–2.

SmartDie® product Manufacturing and Use, WebPage[online]. Developer.Intel.com, ©2000. [Retrieved on Oct. 5, 2000.] Retrieved from the Internet:<URL:http://developer.intel.com/design/smartdie/COB.HTM. pp. 1–10.

Valtronic News– Everything you wanted to know about the Flip Chip, WebPage online. Mar. 1999 Issue. [Retrieved on Oct. 6, 2000.] Retrieved from the internet:<URL:http:www.valtronic.ch/valtronicnews/0399issue/fc.html. pp. 1–5.

Fluxes, WebPage[online]. [Retrieved on Oct. 20, 2000.] Retrieved from the Internet:<URL:www.intelligentdispensing.com/fluxes.htm.

7.0 Board Assembly Effects, WebPage. [Retrieved on Oct. 20, 2000]. Retrieved from the Internet:<URL:http://epims.gsfc.nasa.gov/ctre/act/techdocs/pems/pem7.htm.pp. 1–2.

Composition and Graph diagram, WebPage. [Retrieved on Oct. 24, 2000.] Retrieved from the Internet:<URL:http:www.sv.vt.edu/classes/MSE2094_NoteBook/96ClassProj/pics/Pb_Sn.GIF.p. 1.

ORS Research Safetly News, WebPage [online]. Northwestern University. Research Safety News Article– Lead–free Solder. Safer Solder Swap Suggestion: Lead–free Solder. vol. 16, No. 3, Jul. 2000. [Retrieved on Oct. 24, 2000] Retrieved from the Internet:<URL:http://www.nwu.edu.reseqarch–safety/news/articles/2000articles/1603leadfree.htm p. 1.

Lead free solders—current trends, technology update.WebPage [online].Microtechnology & Reliability Centre, Newsletter 3.[retrieved on Oct. 24, 2000] Retrieved from the Internet:<URL:www.twi.co.uk/news/micro–newslet3.html.p. 1–4.

Approach to BGA Lead–Free, WebPage [online]. [Retrieved on Oct. 24, 2000] Retrieved from the Internet:<URL:http://www.fujitsu.co.jp/hypertext/Products/Device/CATALOG/AD81/81–00004–2e–4.html pp. 1–4.

Manufacturing Test Industry Solutions—Lead Free Solder, Webpage [online]. Agilent Technologies, ©2000.[retrieved on Oct. 24, 2000] Retrieved from the Internet:<URL:http://www.ate.agilent.com/emt/industry/leadfreesolder/index.shtml.p. 1.

The Lead Free Interconnect Project: Statement of Work. WebPage [online]. [retrieved on Oct. 24, 2000] Retrieved from the Internet:<URL:www.nemi.org/PbFreePUBLIC/Project/SOW.html.> pp. 1–6.

No–Clean Technology Review. WebPage [online]. Supercritical Carbon–dioxide Cleaning Technology Review, released in Oct. 1996. [retrieved on Oct. 26, 2000] Retrieved from the Internet:<URL:http://www.pprc.org/pprc/p2tech/noclean/nointro.html. pp. 1–4.

Mirng–Ji Lii, Bob Sankman, Hamid Azimi, Hwai Peg Yeoh & Yuejin Guo. "Flip–Chip Technology on Organic Pin Grid Array Packages" Intel Technology Journal Q3, 2000. pp. 1–9. Aug. 22, 2000.

Ravi Mahajan, Ken Brown & Vasu Atluri. "The Evolution of Microprocessor Packaging". Intel Technology Journal Q3, 2000. pp. 1–10, Aug. 22, 2000.

* cited by examiner

FLUXLESS FLIP CHIP INTERCONNECTION

COPYRIGHT NOTICE

Contained herein is material that is subject to copyright protection. The copyright owner has no objection to the facsimile reproduction of the patent disclosure by any person as it appears in the Patent and Trademark Office patent files or records, but otherwise reserves all rights to the copyright whatsoever.

BACKGROUND OF THE INVENTION

1. Field of the Invention

The invention relates generally to the field of semi-conductor chip packaging. More particularly, the invention relates to the joining of the semi-conductor chip and a substrate using a flip chip process.

2. Description of the Related Art

Traditionally, semi-conductor chips have been electrically coupled to electrical traces on a substrate via wire interconnects that are soldered on one end to the top area of a chip and soldered to trace pads on the substrate that surround the chip on the other end. These types of interconnects are not particularly space-efficient, requiring area for both the footprint of the chip and a trace pad perimeter. To more efficiently utilize the substrate surface and facilitate smaller chip packages, the flip chip interconnection process was developed. Essentially, the active surface of the semi-conductor chip is flipped over to face the substrate and the chip is soldered directly to trace pads located adjacent to the active surface. The result is a more compact and space-efficient package.

One of the most successful and effective methods of electrically connecting a flipped chip to a substrate utilizes controlled-collapse chip connection technology (C4). FIG. 1 illustrates the C4 process. First, as shown in box 105, solder bumps are typically applied to pads on the substrate using any number of suitable processes including plating and vapor deposition. Generally, lead-tin solders having melting points below 200 degrees Celsius are used. Next, in box the solder bumps are re-flowed by heating the solder bumps to a temperature above the solder's melting point, to fully wet the solder bumps to their respective pads. Typically, metal bumps or protrusions having a high lead content are deposited on the corresponding chip pads.

In box 115, a flux is applied to at least one of the surfaces to be joined. Typically, the flux comprises a vehicle and an activator. The flux vehicle acts to isolate the surface of the solder from the atmosphere during a second re-flow, minimizing the risks of oxidation while the solder is hot and/or molten. The flux vehicle is generally tacky and provides an adhesive force to hold the chip and substrate together prior to the second re-flow. The activator is typically an organic or inorganic acid that removes any oxides or surface films present on the solder facilitating solder wetting of the metallic surfaces to be joined. In box 120, the flux bearing surfaces of the chip and substrate are placed in contact with each other in general alignment.

Next, as illustrated in box 125, the second re-flow is performed by heating the chip and substrate package to a temperature above the solder's melting point. The molten solder bumps wet the corresponding metal bumps and the surface tension of the molten solder causes the metal bumps to self-align with each of the corresponding substrate pads. The newly formed interconnects are then cooled to solidify the solder.

Any flux or flux residue is removed from the chip and substrate package in a defluxing operation as indicated in box 130. This operation will typically include solvent washing the package to remove flux residue. A post-interconnection bake cycle may also be specified to volatilize any remaining solvent or low boiling point flux constituents.

An epoxy under-fill is applied between the active surface of the chip and the top surface of the substrate to surround and support the solder interconnects. Under-filling significantly increases the reliability and fatigue resistance of the package's interconnections. The under-fill helps to more evenly distribute stress caused by thermally induced strains due to the differences in coefficients of thermal expansion (CTE) between the chip and substrate across the entire surface of the chip and substrate. If the gap between the interconnected chip and substrate were not under-filled, the stress would be carried by the relatively thin solder interconnects, often resulting in premature package failure. However, in order for the under-fill to perform properly, it must be well-adhered to the chip and substrate surfaces. Even a thin film of flux residue can cause premature delamination of a bonded surface, eventually resulting in failure in one or more of the interconnects. Accordingly, one of the great challenges using C4 technology has been to completely remove all flux residues from the package. This has become especially troublesome as the thickness of the gap between the chip and the substrate has decreased.

The total throughput time (TPT), or the time it takes to create a soldered chip, is affected significantly by the time required to remove residues from the protective flux, which can be particularly time-consuming. For instance, chemical defluxing may take minutes while a post-bake to remove any remaining flux or solvent residue may take several hours. Fluxes have been developed that completely volatilize at elevated temperature. However, because the flux is required in the C4 process to hold the chip and substrate together before re-flow, only those fluxes that have volatilization temperature at or above the solder melting point are suitable for use with the C4 process. The small thickness of the gap distance between the chip and the substrate coupled with the flux's high volatilization temperatures, however, make it difficult, if not impossible, to boil off all of the flux residues during the re-flow process or in a subsequent post-bake operation at a temperature slightly below solder melting temperature. The long post-bake times and defluxing operations required to volatize the flux eliminate any opportunity for significant TPT reductions.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

A flip chip method for interconnecting a chip to a substrate without using flux is described. Through the use of a thermo-compression bonder (or a similarly equipped apparatus) that uses contact pressure to hold the chip and the associated substrate in general alignment prior to re-flow of the solder bumps, the need to use a flux that can adhesively hold the chip and substrate together until solder bump re-flow is eliminated. Accordingly, through the use of a metal cap of an oxidation-resistant noble metal to protect the metal bump (or protrusion) during the elevated temperature joining process, the use of a flux can be eliminated entirely. Advantageously, by eliminating the time-consuming deflux and bake cycles, the TPT is significantly reduced. The use of a thermo-compression bonder to perform the joining operation further deceases the TPT as opposed to prior art C4 joins that used an oven to provide the necessary heat for solder re-flow. Additionally, the integrity of the under-fill bonds with the surfaces of the chip and substrate is potentially increased, resulting in chip packages with higher fatigue resistance and longer expected life-spans.

Figure 1:
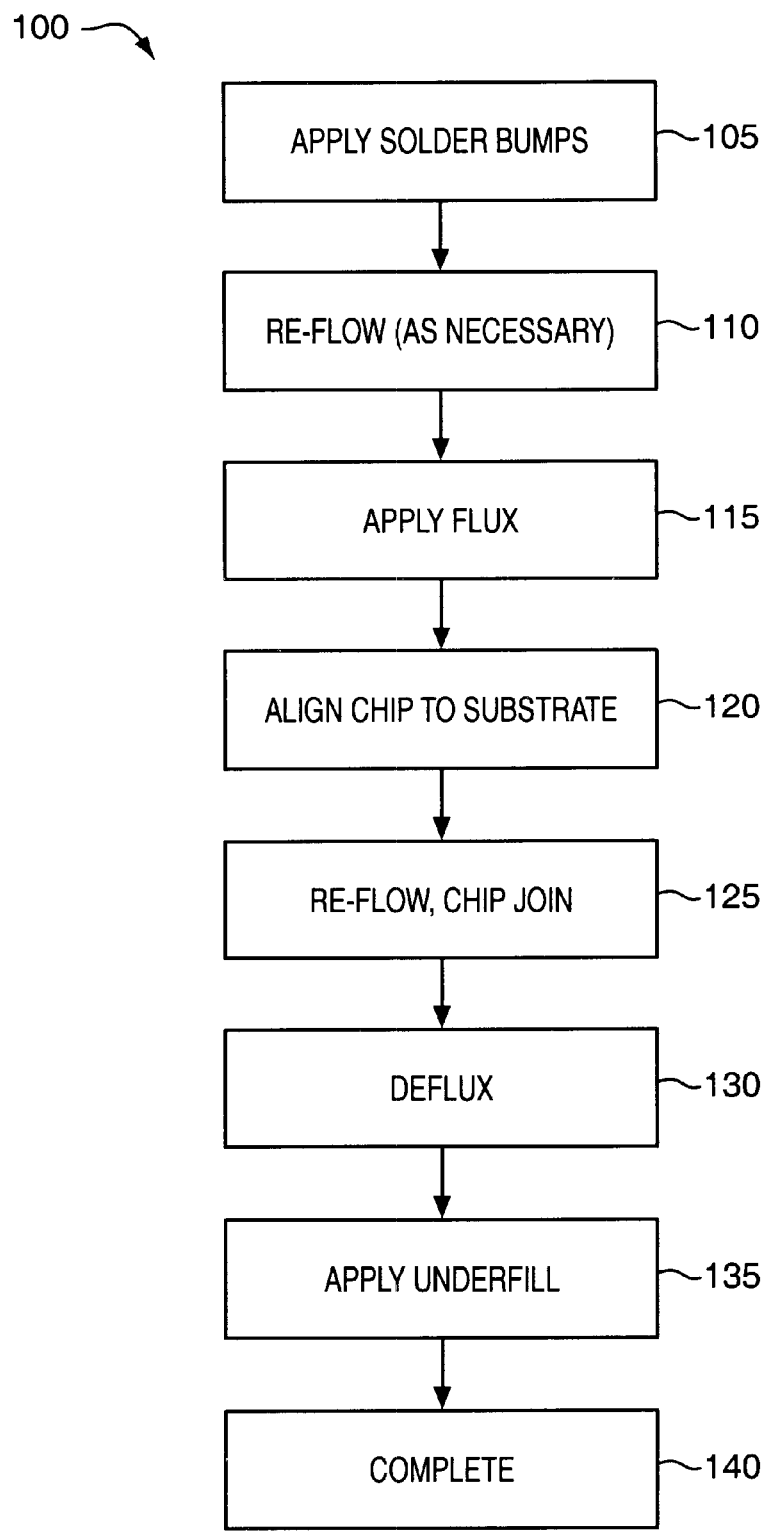
FIG. 1 is a prior art block diagram illustrating the operations typically required to create a flip chip bond using a C4 joining process.
Figure 2:
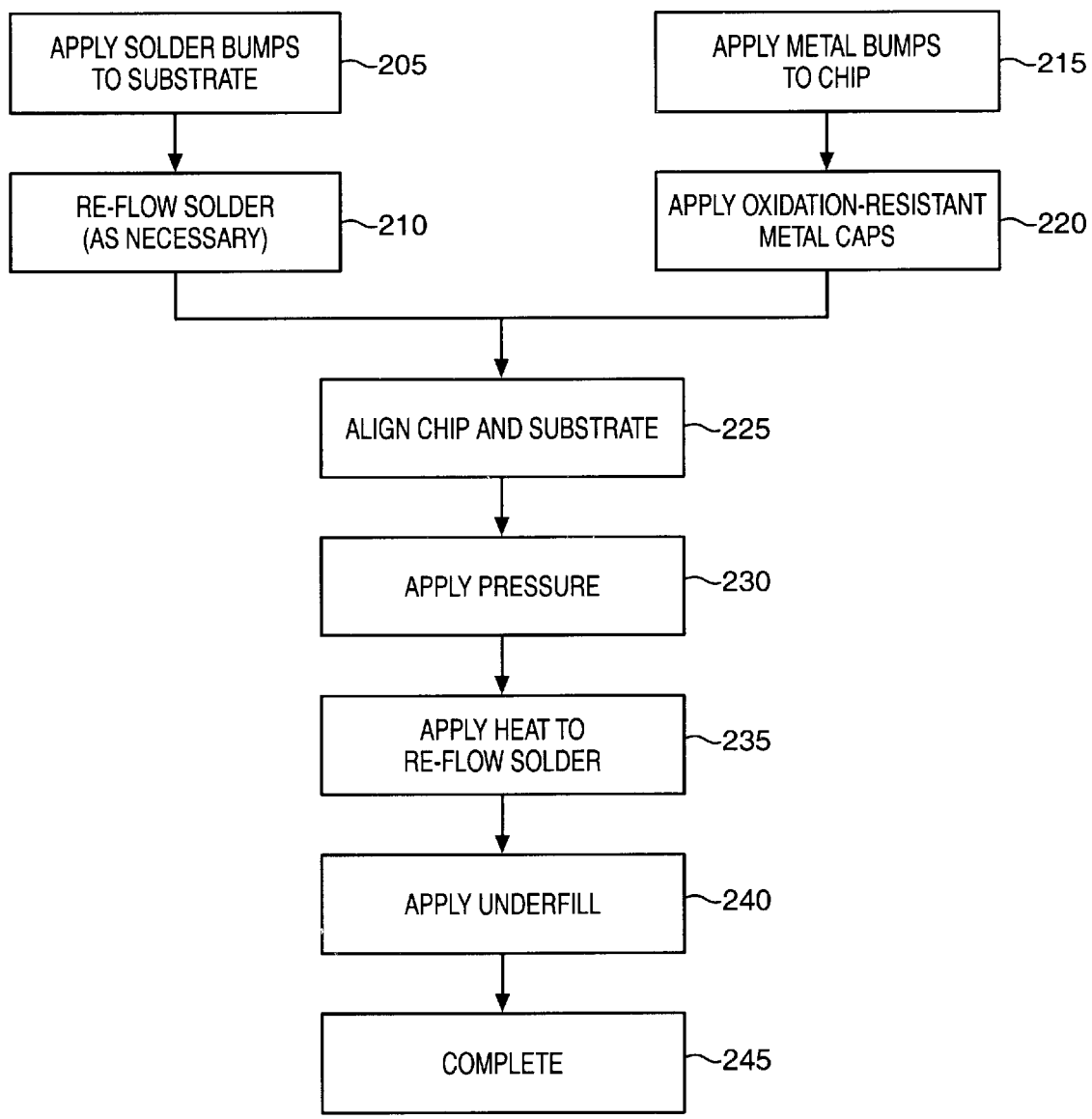
FIG. 2 is a block diagram illustrating the joining process utilized according to one embodiment of the present invention.

FIG. 2 is a block diagram illustrating the joining process utilized according to one embodiment of the present invention. First, as indicated in block 205, a solder is typically applied to bond pads on the top surface of the substrate, although in alternative embodiments the solder may be applied to bond pads on the chip (die) instead. The solder may be applied to the bond pads using any number of suitable techniques known to those skilled in the art, including, but not limited to, vapor deposition and electroplating. After the solder is applied, the substrate is heated to beyond the solder's melting point to re-flow the solder as indicated in block 210 to facilitate complete wetting of the bond pads. In the preferred embodiment, a 96.5% tin/3.5% silver eutectic solder with a melting point of around 221 degrees Celsius is specified, although any number of suitable solder compounds may be utilized. Ideally, lead-free solders are specified, eliminating the potential environmental problems caused by lead.

Typically, as indicated in 215, metal bumps are applied to the bond pads on the chip, although in alternative embodiments the metal bumps may be applied to the substrate instead. The metal bumps may be applied to the bonding pad by any number of methods as would be known to one skilled in the art including, but not limited to, vapor deposition, plating, and wire bumping. Ideally, a bump metal is chosen that has good electrical properties. Traditionally, an oxidation-resistant, lead-based bump metal such as a 97%Pb3% Sn alloy has been utilized in conventional C4 flip chip joining processes. Lead-based bump metals, and solders for that matter, provide necessary oxidation resistance, especially when a flux is used, during the furnace temperature ramp up and hold times utilized in a conventional C4 process. The lead-based bump metals, however, have relatively poor electrical properties, providing significant room for improvement. In embodiments of the present invention, the ramp up and hold times are relatively short (100 degrees @ second ramp and 1–5 second hold); thereby, the potential for significant oxidation is minimized and a more reactive base metal with superior electrical properties may be utilized in the metal bumps. In the preferred embodiment, copper base metal bumps are specified.

Figure 3:
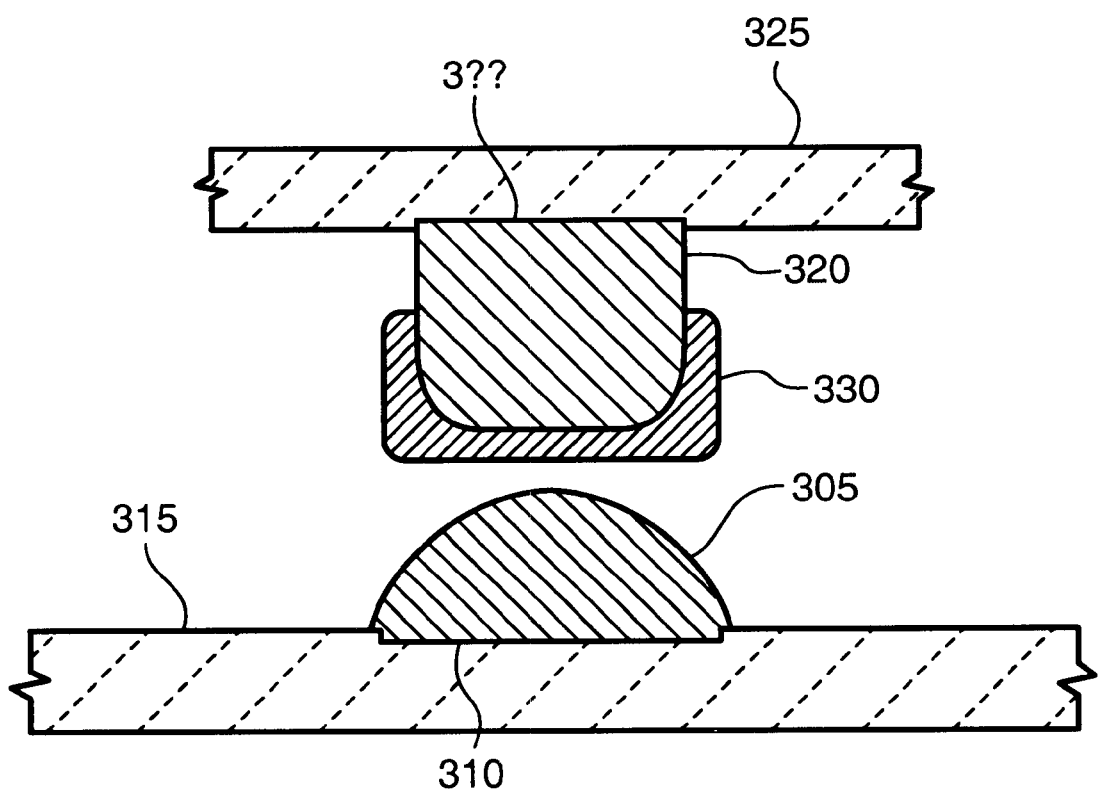
FIG. 3 illustrates a solder bump that has been applied to a bonding pad on a substrate and reflowed, as well as a copper base metal bump coated with a noble metal cap that has been applied to a bonding pad on the top surface of a chip.

To help ensure the surface of the metal bumps remain oxidation free prior to solder re-flow and joining, the joining surfaces of the metal bumps are fitted with a metal cap as indicated in block 220. The metal cap is typically comprised of a metal or metal alloy having good oxidation resistance at elevated temperatures of 100 to 300 degrees Celsius. Suitable metals include the noble metals, such as platinum, iridium, gold and palladium. Preferably, a metal is specified that has reasonable electrical properties as well. The metal caps may be applied to the metal bumps using a number of methods that would be known to one of skill in the art, including plating and vapor deposition. FIG. 3 illustrates a solder bump 305 that has been applied to a bonding pad 310 on a substrate 315 and has been re-flowed. A copper base metal bump 320 that has been applied to a bonding pad 335 on the top surface of a chip 325 is also illustrated. The metal bump 320 has a portion of its surface covered with a palladium metal cap 330 to prevent oxidation of the copper during the chip interconnection process.

Figure 4A:
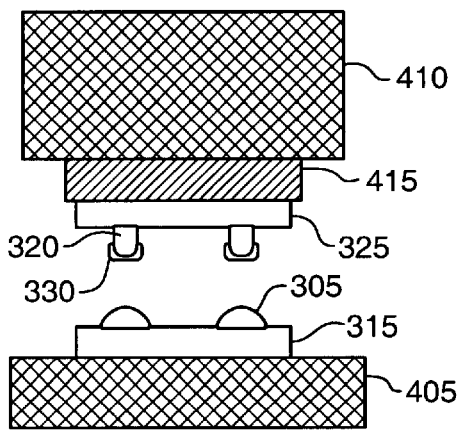
FIGS. 4a–c illustrates a chip and substrate during various operations during the interconnection process.

Referring to block 225 of FIG. 2, the chip 320 is picked up by the head of the thermo-compression bonder and aligned with the substrate 315. A solder bumped substrate 315 aligned with a metal bumped chip is illustrated in FIG. 4A. A thermo-compression bonder is an apparatus often used in chip packaging operations that has the capability to provide heat and pressure through a platen 405 and a moving head 410. Since pressure applied by the thermo-compression bonder is used to hold the chip and substrate together prior to re-flow in the preferred embodiments of the invention, no flux is necessary to hold the chip and substrate together prior to re-flow in contrast to the prior art C4 process. In the preferred embodiment, the lower platen 405 of the thermo-compression bonder is outfitted with a platen heater, so that the platen 405 may be maintained at an intermediate temperature between room temperature and the melting temperature of the solder bumps. In the preferred embodiment, the lower platen 405 is maintained at a temperature of about 135 degrees Celsius. Likewise, the head 410 may be maintained at an intermediate temperature, typically between 30 to 100 degrees Celsius. The head 410 may comprise an internal heating element or as shown in FIG. 4A, a pulse heat tool 415 capable of very rapid heating (e.g., greater than 25 degrees Celsius @ second) may be utilized.

Figure 4B:
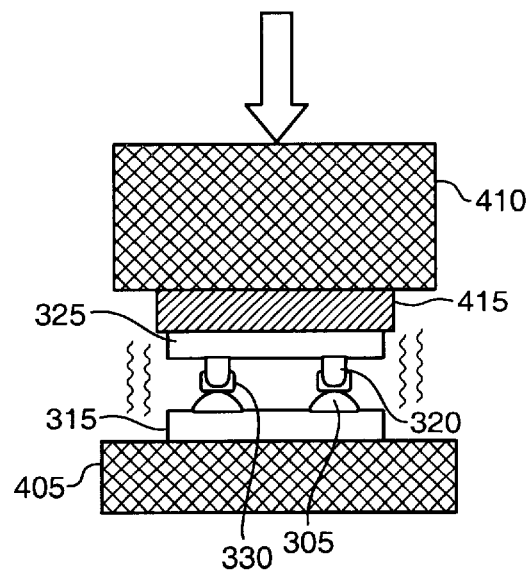
Figure 5:
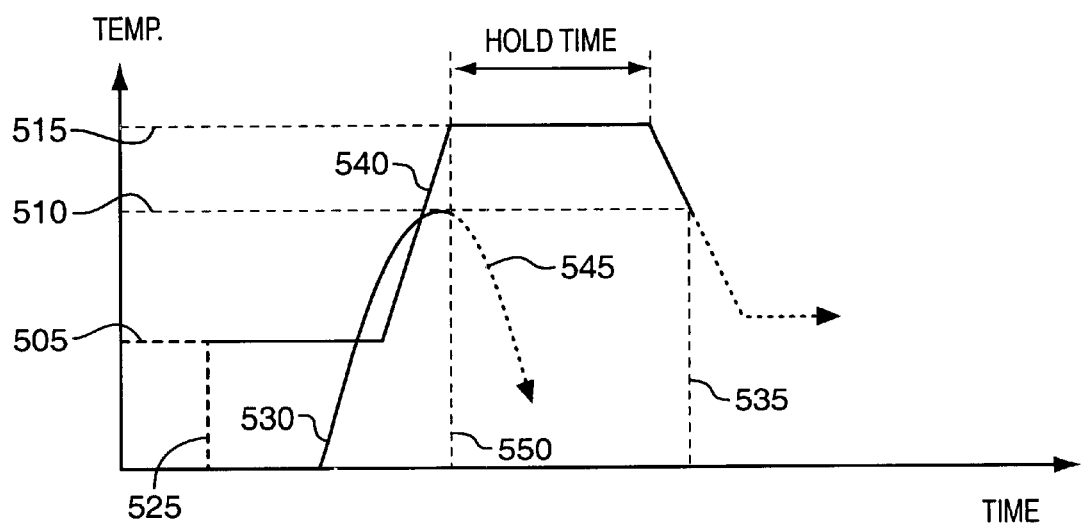
FIG. 5 provides a diagram of a joining cycle that may be utilized in embodiments of the present invention.

Next, in block 230 the interconnection cycle is commenced. First, as shown in FIG. 4B, the cap metal covered base metal bumps 320 of the chip 325 are brought into contact with corresponding solder bumps 305 on the substrate 315 and pressure is applied. In block 235, the pulse heat tool 415 is rapidly heated to a temperature well in excess of the melting point of the solder bumps 305 FIG. 5 illustrates a joining cycle that may be utilized in a preferred embodiment of the present invention. Line 540 represents the temperature of the pulse heat tool 340 at a given time during the cycle. Line 545 is a pressure curve indicating the amount of force applied to the interface between the metal bumps 325 and the solder bumps 305 at a given time. Initially, as discussed supra, the pulse heat tool is maintained at an intermediate temperature such as 30 degrees Celsius.

Figure 4C:
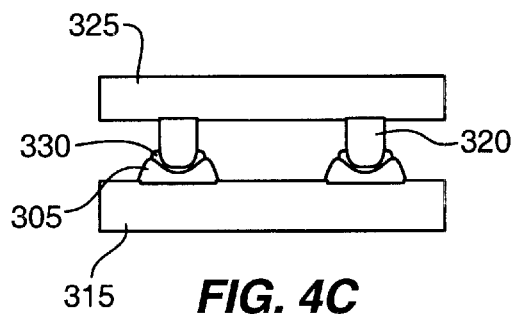

The chip is picked up by the thermo-compression bonder head at time 525. The chip and substrate are aligned and the chip is brought into contact with the substrate and pressure is applied at around time 530. Typically, a force of 2 to 5 kilograms is applied depending on the dimensions of the chip and the number of flip chip connections to be made. Shortly thereafter, the pulse heat tool is energized and rapidly heated to its hold temperature. In the preferred embodiment, heat-up rates on the order of 100 degrees Celsius are specified. The peak hold temperature 515 is typically on the order of 250 to 400 degrees Celsius depending on several factors, including the thickness of the chip, the thermal conductivity of the chip, and the melting point and desired re-flow temperature of the solder bumps 305 Typically, a temperature gradient will be established through the chip such that the temperature at the interface with the solder bumps 305 will be less than the temperature at the interface with the pulse heat tool 415. Accordingly, the hold temperature 515 of the pulse heat tool 415 will typically be greater than the re-flow temperature of the solder bumps 305 At or about time 550, the melting temperature of the solder is reached at the interface between the chip and the substrate and pressure is no longer required to hold the chip and substrate together as the solder bumps begin to melt and wet the metal bumps. Accordingly, the force applied to the chip is released causing the applied pressure to be reduced to zero as indicated by pressure curve 545. While the pulse heat tool is held at temperature 515, the solder bumps become completely molten and re-flow. The wetting of the metal bumps on the chip along with the surface tension of the molten solder tends to promote self-alignment of the chip and substrate, wherein the chip moves laterally small amounts as necessary to minimize the average effective surface tension of all of the interconnects. The pulse heat tool is maintained at temperature 515 for a short period of time, typically 1 to 5 seconds, after which the pulse heat tool 340 is de-energized and the solder bumps re-solidify shortly thereafter. Once the pulse heat tool has reached a temperature 510, about 200 degrees Celsius in the preferred embodiment, the bonded chip and substrate are removed from the thermo-compression bonder, freeing the bonder to perform another chip join. FIG. 4C illustrates a interconnected chip and substrate, wherein the solder bumps have deformed and wetted the capped surface of the metal bumps.

Unlike the C4 wherein the re-flow is performed in an oven, the total period of time that the metal bumps and the solder are exposed to elevated temperatures is very short. Accordingly, there is little time for a significant amount of oxidation to occur to the preferred tin and silver solder bumps. Additionally, the oxides that could inhibit wetting of the bump metal by the solder do not form on the oxidation resistant metal cap at the elevated interconnect temperatures.

Figure 6A:
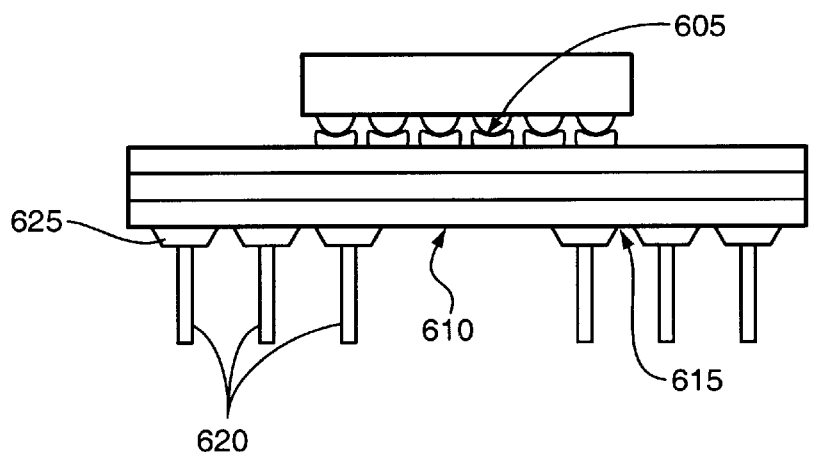
FIG. 6A is an illustration of a chip/substrate package wherein the substrate comprises a pin grid array.
Figure 6B:
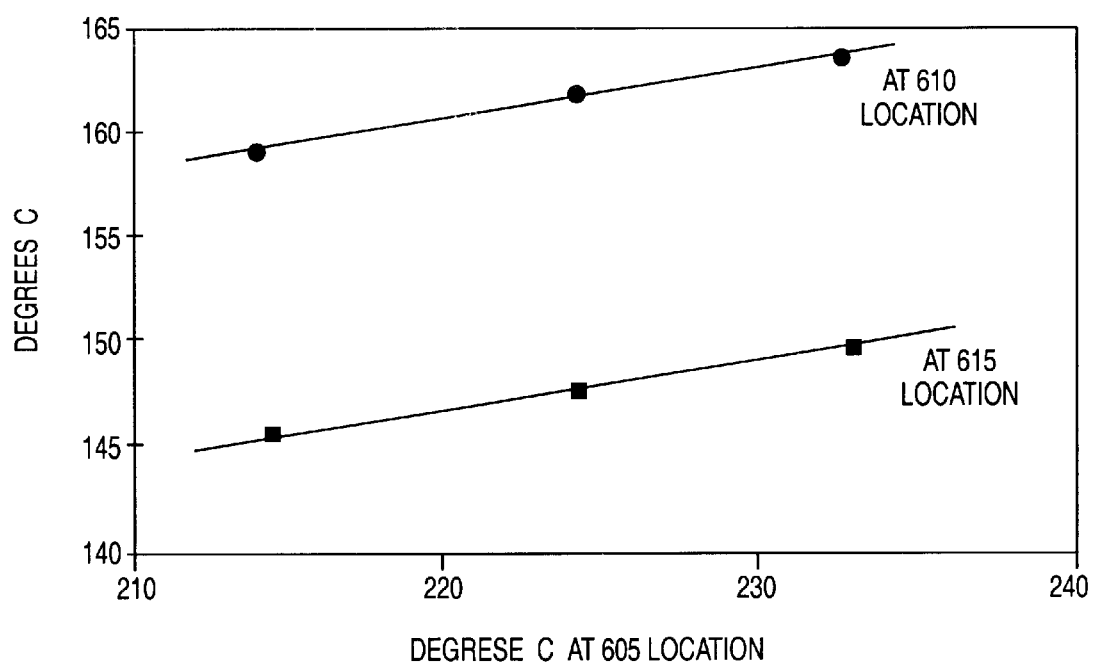
FIG. 6B is a chart derived from experimentation indicating the temperatures observed at several locations on the chip and substrate during a chip interconnection process performed according to an embodiment of the present invention.

In the preferred embodiment, as mentioned supra, a 96.5% Sn 3.5% Ag solder is utilized to form the solder bumps. This solder has a melting point of approximately 221 degrees Celsius and requires a re-flow temperature at least a few degrees greater than the melting point. As discussed supra, prior art methods such as C4 typically utilized lead based solders (such as 37% lead 63% tin) that have melting points of less than 190 degrees Celsius. The lower melting point solders are especially necessary when joining a chip to a pinned substrate using a C4 process, since temperatures in excess of 210 degrees Celsius can cause softening of the pinning solder (typically, 95% tin 5% antimony which begins melting around 232 degrees Celsius), resulting in movement of the pins. In preferred embodiments of the present invention using a 96.5% Sn 3.5% Ag solder, the temperature of the pinning solder does not exceed 200 degrees Celsius. The temperature gradient between the chip-to-pulse heat tool interface at the high end and the platen-to-substrate interface at the low end never has the opportunity to equalize in the short time the pulse heat tool is energized. FIG. 6A is an illustration of a chip/substrate package wherein the substrate comprises a pin grid array (PGA). The pins 620 of the PGA are held in place by pinning solder 620. FIG. 6B is a chart derived from experimentation indicating the temperatures observed at several locations on the chip and substrate during a chip join performed according to an embodiment of the present invention. The temperatures listed along the horizontal axis indicate the temperature at the center of the chip join region 605. It is noted that the melt and re-flow of the preferred solder typically occurs at temperatures between 220 and 235 degrees Celsius. The top line indicates the corresponding temperature at the center of the pin grid array side of the substrate. The bottom line indicates the corresponding temperature at the edge of the pin grid array side of the substrate. As is indicated by FIG. 6B, the temperature on the pin grid array side of the substrate never exceeds 165 degrees Celsius, while the melt temperature of the solder bumps are reached and exceeded to facilitate re-flow and joining.

Referring back to FIG. 2, the gap between the chip and the substrate is typically under-filled with an epoxy resin to substantially increase the longevity, environmental resistance, and fatigue strength of the interconnects as indicated by block 240. Using the prior art C4 process, any flux residues present between the chip and substrate surfaces need to be removed in a de-fluxing operation that typically involves a solvent wash. Furthermore, a bake cycle may be performed to "burn-off" any remaining residue. As can be appreciated, these operations consume significant amounts of time and significantly increase the TPT of chip/substrate interconnection. Using a preferred embodiment of the present invention without flux, the de-flux and bake operations can be eliminated, permitting significant reductions in TPT.

Alternative Embodiments

In the foregoing description, for the purposes of explanation, numerous specific details have been set forth in order to provide a thorough understanding of the present invention. The detailed description and embodiments discussed herein are not intended to limit the scope of the invention as claimed. To the contrary, embodiments of the claims have been contemplated that encompass the full breadth of the claim language. Accordingly, the present invention may be practiced without some of the specific detail provided herein.

For instance, the embodiments of the invention have been described above primarily in terms of a flip chip joining process using a thermo-compression bonder. It is conceivable that other apparatus may be used to accomplish the limitations of the clams as would be obvious to one of ordinary skill in the art. Likewise, although the process has been described in terms of an exemplary embodiment wherein a 96.51 % tin 3.5% silver solder is used, other suitable solders are contemplated. In the preferred embodiment, the pressure applied to the chip against the substrate is removed once the solder bumps have begun to melt, however alternative embodiments are contemplated wherein at least some pressure is maintained against the chip throughout the interconnection process. Furthermore, in other alternative embodiments it is contemplated that a thin coating of no-clean flux having a volatilization temperature below the melting temperature of the solder may be applied to the solder bumps to remove any oxides from the solder bumps during heat up. The no-clean flux would completely boil off prior to completion of the chip join, eliminating the need for any subsequent de-fluxing or bake operations. In the embodiments described heretofore, the metal bumps have been applied to the chip surface and the solder bumps have been applied to the substrate, however it is contemplated the placement of the metal and solder bumps may be reversed.

What is claimed is:

1. A method comprising:

aligning a substrate with a corresponding chip,
the substrate having opposing a first and second substrate surfaces, the first substrate surface having a plurality of solder bumps attached thereto,
the solder bumps having a melting temperature,
the chip having opposing first and second chip surfaces, the first chip surface having metal protrusions attached thereto,
the metal protrusions at least partially covered with a metal cap, the metal protrusions primarily comprising a first metal and the metal cap primarily comprising a second metal;
bringing the plurality of solder bumps and the plurality of bump metal protrusions in contact with each other; and
heating the plurality of solder bumps to a first temperature greater than the melting temperature to melt the plurality of solder bumps.

2. The method of claim 1, wherein said the bringing the plurality of solder bumps and the plurality of bump metal protrusions in contact with each other, further comprises applying a contact force.

3. The method of claim 2, wherein the contact force is released once the plurality of solder bumps have begun to melt during said heating the plurality of solder bumps to a first temperature.

4. The method of claim 1, wherein said heating the plurality of solder bumps to a first temperature comprises creating a temperature gradient through the chip by rapidly heating the second chip surface fixture to a second temperature, the second temperature being much greater than the first temperature.

5. The method of claim 4, wherein heat to accomplish said rapidly heating the second chip surface is provided by a heater in contact with the second chip surface.

6. The method of claim 4, wherein a third temperature at the second substrate surface is significantly below the first temperature, when the plurality of solder bumps are at the first temperature.

7. The method of claim 1, further comprising maintaining the plurality of solder bumps at a temperature at or above the first temperature for a period of time.

8. The method of claim 1, wherein the second metal is a metal or metal alloy that is oxidation resistant at elevated temperatures.

9. The method of claim 1, wherein the plurality of solder bumps are comprised of a lead-free solder.

10. The method of claim 4, wherein said rapidly heating the second chip surface to a second temperature is accomplished using a heat up rate in excess of 50 degrees Celsius a second.

11. A method comprising:

placing either a substrate or a chip in a first fixture,
the substrate or chip having deposited thereon a plurality of solder bumps, the solder bumps having a melting point at a first temperature,
the first fixture being maintained at a second temperature below the first temperature;
placing the other of the chip or the substrate in a second fixture,
the other of the chip or substrate have affixed thereto a plurality of metal protrusions primarily comprised of a first metal, the plurality of metal protrusions each being at least partially coated a metal cap, the metal cap primarily comprising a second metal;
bringing the plurality of solder bumps into contact with the plurality of metal protrusions by moving the one or both of the first and second fixtures towards each other;
rapidly heating a heater coupled with the first or second fixtures from a third temperature to a fourth temperature,
the third temperature being lower than the first temperature, and
the fourth temperature being higher than the first temperature;
holding the heater approximately at or above the fourth temperature until the plurality of solder bumps have melted and have wetted at least a portion of the metal cap of each metal protrusion.

12. The method of claim 11, wherein the heater, and the first and second fixtures comprise a thermo-compression bonder.

13. The method of claim 11, wherein the substrate has deposited thereon the plurality of solder bumps, and the chip has affixed thereto a plurality of metal protrusions.

14. The method of claim 11, wherein the pulse heat tool is held at the fourth temperature for a period of time approximately between 1 and 5 seconds.

15. The method of claim 11, wherein said bringing the plurality of solder bumps into contact with the plurality of metal protrusions further comprises applying a contact force to hold the plurality of solder bumps and metal protrusions in contact with each other.

16. A flip chip method of joining a chip and substrate comprising:

applying metal protrusions to electrical interconnect pads on an active surface of a chip, the chip also having second surface opposite the active surface, the metal protrusions comprising a first metal and having a surface, wherein a metal cap comprising an oxidation resistant metal or metal alloy is cover at least a portion of the surface;
applying lead-free solder bumps to electrical interconnect pads on a top surface of a substrate, the substrate also having a bottom surface opposite the top surface, the solder bumps having a melting temperature, the melting temperature being within the range of 200–240 degrees Celsius;
placing the bottom surface of the substrate on a platen of a thermo-compression bonder, the platen being maintained at a first temperature that is less than the melting temperature, the first temperature being within the range of 70–190 degrees Celsius;
affixing the second surface of the chip to a head of the thermo-compression bonder, the head including a heater, the head being maintained at a second temperature, the second temperature being less than 120 degrees Celsius;
generally aligning the solder bumps with corresponding metal protrusions;
lowering the head or raising the platen to bring the solder bumps into contact with the metal protrusions;

applying a contact force to hold the solder bumps and corresponding metal protrusions together;

rapidly increasing the temperature of the heater to a third temperature until the top surface of the substrate reaches a fourth temperature, the third temperature being within the range of 250–400 degrees Celsius, the fourth temperature being greater than the melting temperature; and holding the top surface at the fourth temperature for a period of time.

17. The method of claim 16, further comprising releasing the contact force after the solder bumps have begun to melt, but before the period of time has expired.

18. The method of claim 16, further comprising:

removing an interconnected chip and substrate package from the thermo-compression bonder after the period of time has expired and the solder bumps have solidified.

19. The method of claim 16, wherein the solder bumps are comprised of a tin based solder.

20. A method comprising:

applying a plurality of metal protrusions to a chip surface of a chip, the plurality of metal protrusions primarily comprising a first metal; and coating the plurality of metal protrusions, at least partially, with metal caps, the metal caps primarily comprising a second metal.

21. The method of claim 20, wherein the metal protrusions are applied to electrical bonding pads located on the chip surface.

22. The method of claim 20, wherein the second metal is resistant to oxidation at elevated temperatures between 175 and 250 degrees Celsius.

23. The method of claim 20, wherein the first metal is copper.

* * * * *

UNITED STATES PATENT AND TRADEMARK OFFICE
CERTIFICATE OF CORRECTION

PATENT NO. : 6,495,397 B2
DATED : December 17, 2002
INVENTOR(S) : Kubota et al.

It is certified that error appears in the above-identified patent and that said Letters Patent is hereby corrected as shown below:

Column 1,
Line 41, after "in box", insert -- 110, --.

Column 3,
Line 54, before "215", insert -- block --.

Signed and Sealed this

Twenty-fifth Day of November, 2003

JAMES E. ROGAN
*Director of the United States Patent and Trademark Office*